(12) United States Patent
Takezawa et al.

(10) Patent No.: US 6,488,869 B2
(45) Date of Patent: Dec. 3, 2002

(54) CONDUCTIVE PASTE, ITS MANUFACTURING METHOD, AND PRINTED WIRING BOARD USING THE SAME

(75) Inventors: Hiroaki Takezawa, Katano; Minehiro Itagaki, Moriguchi; Yoshihiro Bessho, Higashiosaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/056,774

(22) Filed: Apr. 8, 1998

(65) Prior Publication Data

US 2002/0008228 A1 Jan. 24, 2002

(30) Foreign Application Priority Data

Apr. 8, 1997 (JP) .............................................. 9-089433

(51) Int. Cl.[7] .................................................. H01B 1/02
(52) U.S. Cl. ........................ 252/513; 252/512; 252/518; 148/24; 428/209
(58) Field of Search .................................. 252/513, 512, 252/518; 148/22, 24; 428/209

(56) References Cited

U.S. PATENT DOCUMENTS

| 4,683,653 A | * | 8/1987 | Iwasa ........................... 156/322 |
| 4,724,040 A | * | 2/1988 | Iwasa ........................... 427/103 |
| 4,904,414 A | | 2/1990 | Peltz ............................ 252/514 |
| 5,242,511 A | * | 9/1993 | Yokoyama et al. ......... 252/514 |
| 5,503,777 A | * | 4/1996 | Itagaki et al. .......... 252/519.21 |
| 5,817,190 A | * | 10/1998 | Takezawa et al. ............. 148/23 |

FOREIGN PATENT DOCUMENTS

| JP | 62-198186 | 9/1987 |
| JP | 2-122472 | 10/1990 |
| JP | 4-268381 | 9/1992 |
| JP | 8-218006 | 8/1996 |
| JP | 8-283624 | 10/1996 |

OTHER PUBLICATIONS

Japanese-language Office Action dated Sep. 4, 2001.

* cited by examiner

*Primary Examiner*—Cathy Lam
(74) *Attorney, Agent, or Firm*—Smith, Gambrell & Russell, LLP

(57) ABSTRACT

A conductive paste has conductive particles having metal particle surface coated with a complex of same metal of less than 10 nm in thickness and not having spontaneous oxide film on said metal particles, and a binder mainly composed of an insulating resin.

24 Claims, 4 Drawing Sheets

CONDUCTIVE PASTE, ITS MANUFACTURING METHOD, AND PRINTED WIRING BOARD USING THE SAME

BACKGROUND OF THE INVENTION

1. Field of the Invention

The present invention relates to a conductive paste used in electrical connection between a printed wiring board and an electronic component, or in via hole of a printed wiring board.

2. Related Art of the Invention

In the recent trend of heightened consciousness about environmental problems, used of lead in soldering is being regulated in the field of electronics mounting. It is hence an urgent matter to develop a lead-free bonding technology.

At the present, there is no lead-free solder having a performance equivalent that of the existing eutectic solder, and the conductive paste is highly expected.

In the conventional conductive paste, generally, conductive particles are disposed in insulating resin components, and after connection of electrodes, the resin is cured to keep conduction at the junction by mutual contact of particles.

However, the conventional conductive paste had the following problems.

First, noble metals such as silver, gold and palladium must be used as conductive particles, the material cost was high. The reason of using noble metals is that, in base metals such as copper and iron, insulating spontaneous oxide films formed on the metal surface are grown with the passing of the time, and the connection resistance is raised.

Second, since the metal is exposed on the surface of metal such as silver of metal particles used as conductive particles, if left over in high temperature or high humidity condition after connection, migration occurs between adjacent electrodes, and insulation failure occurs.

SUMMARY OF THE INVENTION

In the invention, accordingly, considering such problems of conductive particles using noble metals in the prior art, it is intended to present a conductive paste low in material cost and high in connection reliability and insulation reliability, its manufacturing method, and a printed wiring board using the same.

The conductive paste of the invention is composed of conductive particles having the surface of base metal particles of copper, iron, nickel, zinc, tin or the like, covered not with a spontaneous oxide film but with a very thin complex of such metal, and a binder mainly composed of insulating resin.

The manufacturing method of conductive paste of the invention is to knead the conductive particles obtained by immersing and drying metal particles in a solution containing a chelating agent, and the binder mainly composed of insulating resin.

The printed wiring board of the invention is a wiring board fabricated by using the conductive paste of the invention as a conductive paste for filling up via holes.

Figure 1:
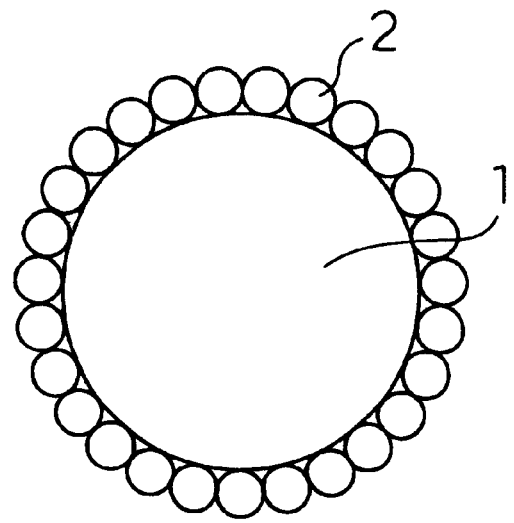
FIG. 1 is a schematic diagram of conductive particles in an embodiment of the invention.

REFERENCE NUMERALS 1, 3 Base metal particle
2, 5 Complex
4 Contact portion
6 Glass epoxy base material
7 Copper comb pattern
8 Land
9, 10 electrode
11 Ceramic base material
12, 13 Copper electrode (gold-plated)
14 Conductive paste
15 QFP
16, 17 Lead
18 Multi-layer printed wiring board
19 Laminate base material
20 Copper foil
21 Via hole conductor

PREFERRED EMBODIMENTS OF THE INVENTION

Referring now to the drawings, embodiments of the invention are described in detail below.

The conductive paste of the invention is characterized as comprising conductive particles of which a base metal particle surface is covered with a complex of a same metal, with the complex being less than 10 nm in thickness, for example, the complex being aligned in a monomolecular form, and a binder mainly composed of insulating resin. It is preferable that this complex is insoluble in water to form the conductive paste of the invention. The manufacturing method of the conductive paste of the invention is characterized by immersing base metal particles of iron, copper, nickel, zinc, tin or the like in a solution composed of a chelating agent and a solvent, heating and removing the solvent, and kneading the obtained conductive particles with a binder mainly composed of insulating resin.

The chelating agent is required to have properties of at least dissolving an oxide of base metal such as iron, copper, nickel, zinc, tin or the like, and forming a complex with such metal.

The chelating agent is also preferred to form a complex insoluble in water. The chelating agent satisfying this condition is preferably at least one selected from the group consisting of oxalic acid, succinic acid, anthranilic acid, gallotannic acid, quinaldinic acid, quinoline-8-carboxylic acid, thiourea, pyrogallol, phenyl fluorone, 4-chloro-3-methyl-5-nitrobenzene sulfonic acid, and rhodamine B.

The chelating agent is further preferred to have a sublimating property. As the chelating agent satisfying these conditions, at least one of oxalic acid, anthranilic acid, and quinoline-8-carboxylic acid is used.

Moreover, in the printed wiring board of the invention, the conductive paste of the invention is used as conductive paste for filling up via holes.

Thus, the conductive paste of the invention is composed of conductive particles of which surface of base metal particles is covered not with a spontaneous oxide film but with a monomolecular complex of the same metal, and a binder mainly composed of insulating resin. FIG. 1 shows a schematic diagram of conductive particles of the invention, owing to the presence of the complex 2 existing on the surface of base metal particles 1, oxygen cannot invade into the metal surface of conductive particles, and formation and growth of insulating spontaneous oxide film are inhibited. Accordingly, when electronic components are connected by the conductive paste of the invention, although the particle metal is a base metal such as copper, iron, nickel, zinc, tin or the like, the connection resistance is not raised with the passing of the time.

Figure 2:
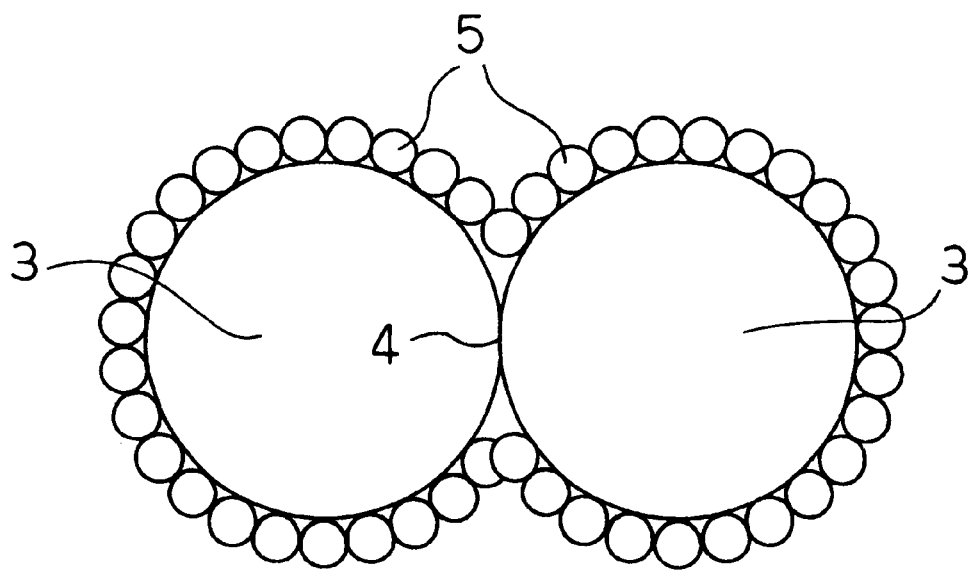
FIG. 2 is a schematic diagram for explaining the action of conductive particles in the invention.

This complex is insulating like the spontaneous oxide film, but since it is aligned in a monomolecular form on the metal surface, it is extremely thin, and is not so strong in adhesion to the metal. Therefore, as shown in FIG. 2, when conductive particles of the invention are gathered, due to mutual contact of base metal particles 3, only the complex in the contact portion 4 is peeled off, and mutual electrical contact of particles is assured. In other area than the contact portion, the complex 5 is left over and the resistance to oxidation is maintained. Herein, as far as the complex is a very thin film of less than 10 nm in thickness, the conduction is assured by mutual contact of particles, and there is no effect on the connection resistance.

Moreover, when the complex is insoluble in water, if left over in the condition of high temperature and high humidity after mounting, ions are not released, and insulation failure by migration does not occur, which is very preferable.

The manufacturing method of the conductive paste of the invention comprises the steps of immersing base metal particles of iron, copper, nickel, zinc, tin or the like in a solution composed of a chelating agent and a solvent, heating and removing the solvent, and kneading the obtained conductive particles with a binder mainly composed of insulating resin. This chelating agent has the property of reacting chemically with the spontaneous oxide on the metal surface, dissolving the oxide, and forming the complex as the reaction product. Accordingly, by treating the base metal particles in the solution in which the chelating agent is dissolved, the spontaneous oxide film on the base metal particles is removed, and a film of the complex is formed instead. This reaction is a monomolecular reaction, and hence the film of the complex is aligned in a monomolecular form on the surface of base metal particles. Thus, according to this manufacturing method, since the conductive paste containing conductive particles free from spontaneous oxide film on the particle surface is obtained, in spite of using base metal, the connection resistance is not raised after mounting the parts. Still more, since the complex is peeled off in the mutual contact portion of conductive particles, a favorable connection reliability is obtained.

The chelating agent used in the manufacturing method of the invention is at least one of oxalic acid, succinic acid, anthranilic acid, gallotannic acid, quinaldinic acid, quinoline-8-carboxylic acid, thiourea, pyrogallol, phenyl fluorone, 4-chloro-3-methyl-5-nitrobenzene sulfonic acid, and rhodamine B.

In the above manufacturing method of conductive paste of the invention, when the chelating agent has a sublimating property, after immersing the metal particles in the solution of chelating agent, by heating at about 100° C., the chelating agent left over on the particles without forming complex can be removed, and the film thickness of the coating on the particle surface is decreased, and the connection resistance after mounting parts is further lowered, so that it is preferred as the chelating agent to be used in the invention. Such chelating agent may be at least one of oxalic acid, anthranilic acid, and quinoline-8-carboxylic acid. In this case, the complex formed on the metal particles is, depending on the kind of the chelating agent being used, metal salt of oxalic acid, metal salt of anthranilic acid, or metal salt of quinoline-8-carboxylic acid.

In the printed wiring board of the invention, the conductive paste of the invention is used as the conductive paste for filling up via holes, and therefore the interlayer connection reliability can be enhanced more than in the prior art.

Incidentally, if the manufacturing method of the conductive paste of the invention is applied in other condition than mentioned above, the performance of the conductive paste may be lowered, and it is not preferred for the invention. Such example is given below.

If the chelating agent does not have the property of dissolving metal oxide, film of complex is not formed on the surface of conductive particles, and the spontaneous oxide film is left over, which causes to elevate the connection resistance after mounting of pats, and hence it is not preferred as the manufacturing method of the conductive paste of the invention.

EXAMPLES

Examples of the conductive paste of the invention and its manufacturing method are described below.

Copper particles (mean particle size 2 μm) were immersed in a solution of 5 parts by weight of chelating agent dissolved in 100 parts by weight of isopropyl alcohol as solvent, and dried for about 30 minutes at 100° C., and conductive particles were prepared. By kneading 1.8 g of obtained conductive particles and 0.2 g of epoxy/acrylic resin (Lock-Tight 3016, Nippon Lock-Tight) by three rolls, conductive paste was prepared.

In thus prepared conductive paste, the connection reliability was tested in the following methods (insulation resistance test and connection resistance test).

Insulation Resistance Test

Figure 3:
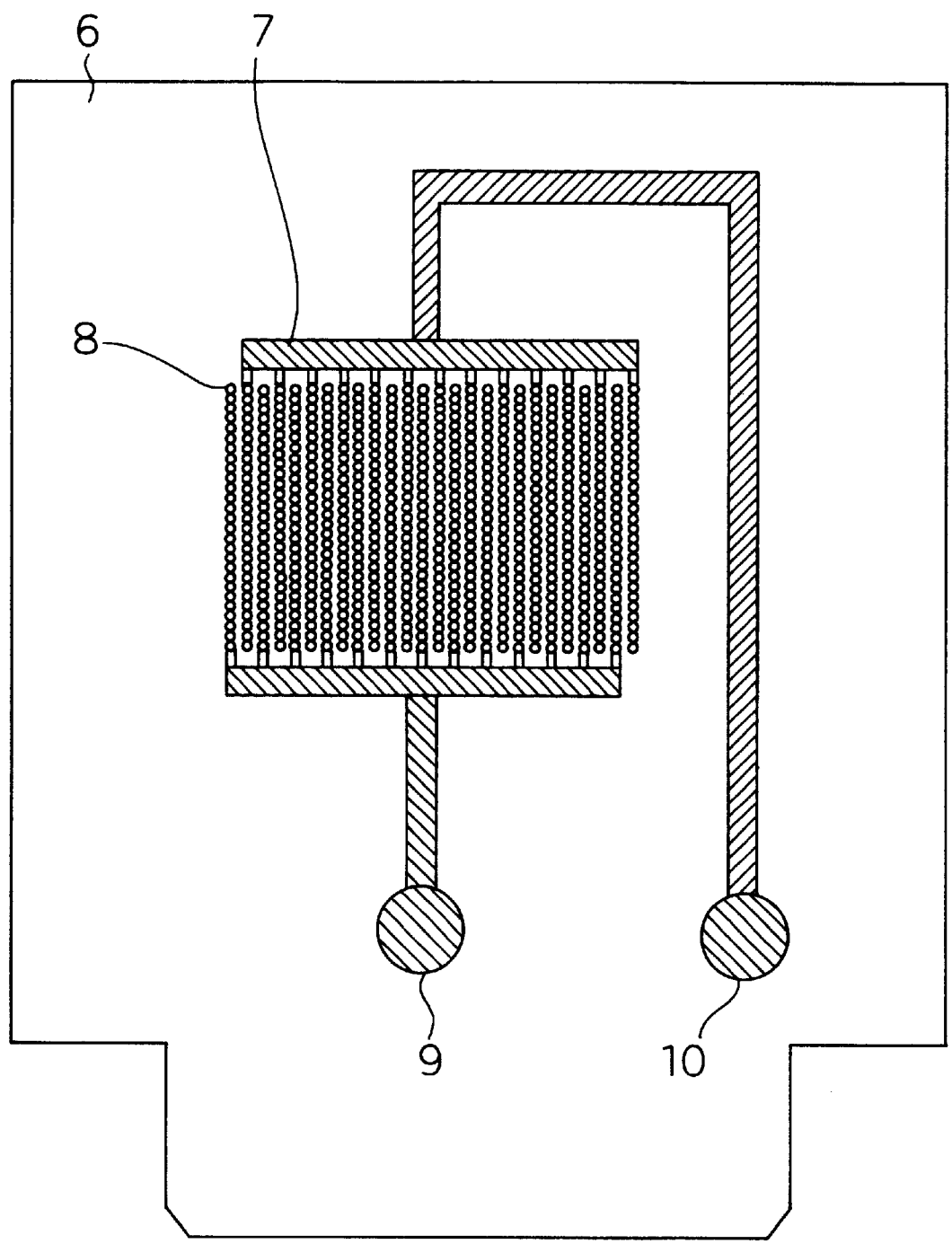
FIG. 3 is a diagram showing an insulating resistance testing board in the invention.

A conceptual diagram of board for insulation resistance test is shown in FIG. 3. A copper comb pattern 7 (pitch: 1.0 mm) is disposed on a glass epoxy base material 6, and the glass epoxy base material 6 and the pattern 7 are covered with photoresist except for the land 8 (number of lands: 16×26, pitch: 1.0 mm, 0.6 mm in diameter). The land 8 is electroless-plated with gold.

By screen printing of the conductive paste on the land 8, the paste was cured by drying for 30 minutes at 150° C., and the board for evaluation was obtained. The board for evaluation was put in a thermohygrostat until the board was completely in the atmosphere of constant temperature and constant humidity, and a voltage was applied between electrodes 9 and 10, and time-course changes of insulation resistance between the electrodes were measured.

The testing conditions were temperature: 85° C., humidity: 95% RH, applied voltage: 50 V DC, and test time: 500 hours.

The criterion of evaluation of insulation reliability is as follows.

⊙: Insulation resistance always held above $10^{10}\Omega$ or more.
◯: Insulation resistance lowered to between $10^{9}\Omega$ or more and less than $10^{10}\Omega$
X: Insulation resistance lowered to less than $10^{9}\Omega$ s.

Connection Resistance Test

Figure 4:
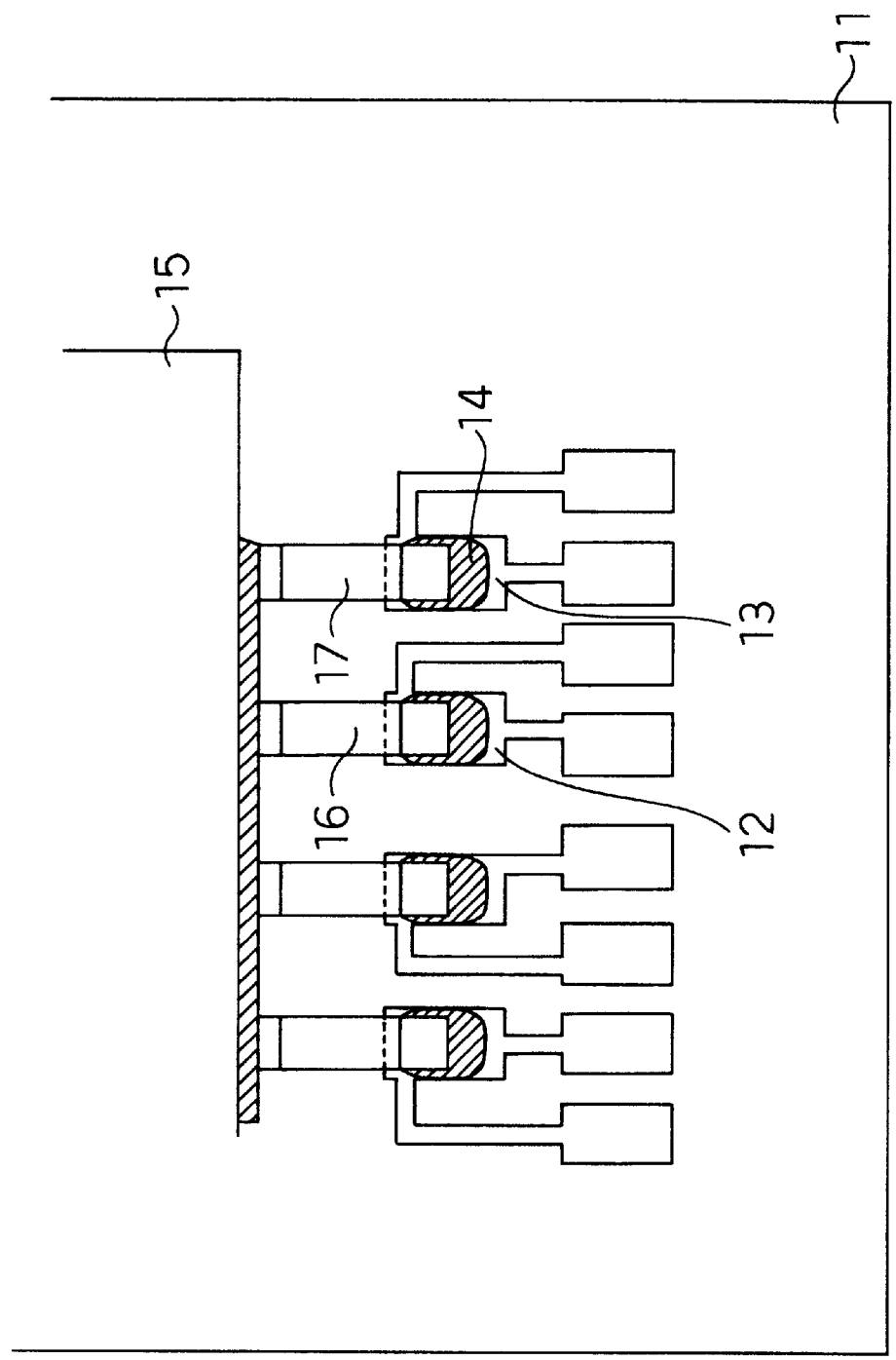
FIG. 4 is a diagram showing a connection resistance testing method in the invention.

The testing method of connection resistance is shown in FIG. 4. Copper electrodes 12, 13 are disposed on a ceramic base material 11, and the surface of 12 and 13 is electroless-plated with gold. By a conductive paste 14, feet 16, 17 of QFP (quad flat package) 15 were respectively adhered onto 12, 13, and the paste was cured by drying for 30 minutes at 150° C., and a sample was obtained. This sample was put in a thermal impact tester, and time-course changes of resistance between 12 and 13, and 16 and 17 were measured by four-terminal method in the thermal impact condition.

The testing conditions were −45 to 125° C. (held for 30 minutes at each temperature), and 1,000 cycles. The criterion of evaluation of connection reliability is as follows.

⊚: Connection resistance always held at less than 10 mΩ.
○: Connection resistance raised to between 10 mΩ or more and less than 20 mΩ.
X: Connection resistance raised to 20 mΩ or more.

In the embodiment, copper was used as base metal particles, but not limited to copper, for example, iron, nickel, zinc, solder and other metals may be used as far as a spontaneous oxide film is formed usually. As the resin component, Lock-Tight 3016 of epoxy/acrylic derivative (manufactured by Nippon Lock-Tight) was used, but not limited to this, other resin capable of assuring the adhesion sufficiently may be used.

Test results are summarized in Table 1.

insoluble in water and having sublimating property as chelating agent presented an excellent insulation reliability same as in examples 1 and 2. The connection reliability was similar to that of the prior art, and produced better results than in examples 1 and 2.

Comparison

When acetyl acetone not dissolving oxide film was used as chelating agent, spontaneous oxide film was left over on the conductive particles, and the film thickness increased with the passing of the time, and the connection reliability was lowered.

As described in the embodiments herein, by connecting the parts by using the conductive paste composed of the conductive particles of the invention and manufactured by its method, although base metal was used as metal particles, excellent results were obtained in insulation reliability and connection reliability. As a result, the conductive paste of high reliability was presented at low cost.

Above all, example 3 presented the best connection reliability, and is hence most preferable as the conductive particles and manufacturing method of the invention.

In the foregoing embodiments, isopropyl alcohol was used as the solvent, but not limited to this, other any solvent

TABLE 1

Test results

| | | Chelating agent | | | | Test result | |
|---|---|---|---|---|---|---|---|
| Item | Name | Oxide film dissolving power | Water solubility of complex | Sublimation | Particle metal | Insulation resistance | Connection resistance |
| Example 1 | Iminodiacetic acid | Yes | Soluble | No | Cu | ○ | ○ |
| Example 2 | Succinic acid | Yes | Insoluble | No | Cu | ⊚ | ○ |
| Example 3 | Anthranilic acid | Yes | Insoluble | Yes | Cu | ⊚ | ⊚ |
| Prior art 1 | — | — | — | — | | × | ⊚ |
| Comparison | Acetyl acetone | No | Insoluble | No | Cu | ⊚ | × |

Results in Table 1 are discussed below.

Prior Art 1

Migration occurred in the conductive paste using silver as conductive particles in the prior art.

Example 1

The conductive particles manufactured by using iminodiacetic acid dissolving oxide film as chelating agent presented an excellent insulation reliability as compared with the prior art. The connection reliability is slightly inferior to that of the prior art, but it is a sufficiently practical level.

Example 2

In the conductive particles manufactured by using succinic acid dissolving oxide film and producing a complex insoluble in water as chelating agent, the connection reliability is slightly inferior to that of the prior art, but it is a sufficiently practical level. On the other hand, the insulation reliability was superior to that of example 1.

Example 3

The conductive particles manufactured by using anthranilic acid dissolving oxide film, producing a complex may be used as far as it dissolves the chelating agent and is evaporated at temperature around 100° C., such as monovalent alcohols, ketones, and esters. Specific examples include ethyl alcohol, methyl alcohol, acetone, methyl ethyl ketone, butyl acetate, and ethyl acetate.

Also in the embodiments, the heating condition was 100° C. for 30 minutes, but this is not limitative as far as the solvent is evaporated completely, but if lower than 60° C., it takes a long time until the solvent is evaporated completely. Or, if higher than 180° C., it may induce deterioration of the resin of the conductive paste or the resin of the board. Hence, the heating condition is preferred to be within 60 to 200° C. and 15 to 60 minutes.

Examples of printed wiring board of the invention are described below.

Example 4

Figure 5:
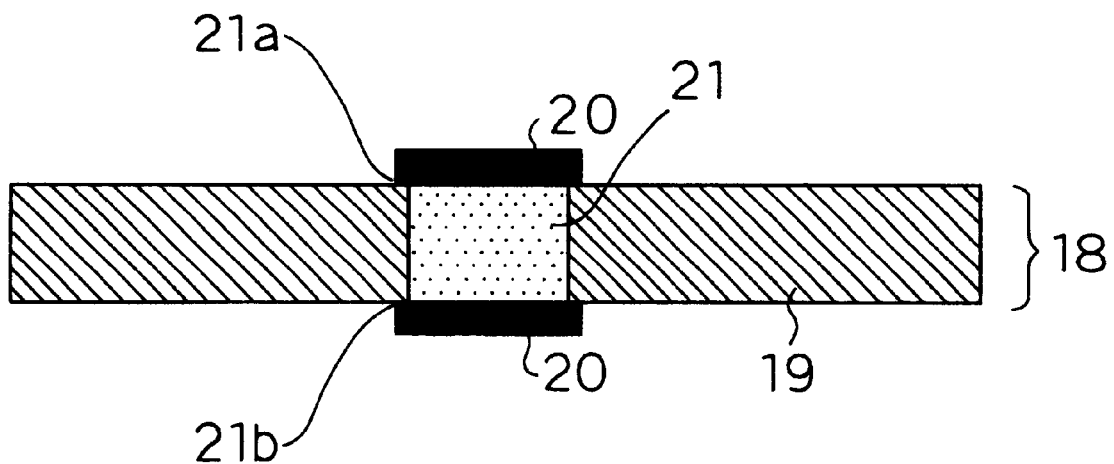
FIG. 5 is a sectional view showing a multi-layer printed wiring board of the invention.

FIG. 5 shows a conceptual diagram of a multi-layer printed wiring board using the conductive paste of the invention as the conductive paste for filling up via holes.

The multi-layer printed wiring board 18 is composed of a laminate base material 19 which is an insulating base material, a copper foil 20 which is an electrode layer, and a via hole conductor 21 formed by curing conductive paste.

A preparing method of conductive paste is described. Exactly 0.8 g of spherical copper particles (mean particle size 2 μm) was immersed in a solution dissolving 5 parts by weight of anthranilic acid and 100 parts by weight of isopropyl alcohol, and conductive particles were prepared by drying for about 30 minutes at 100° C. Consequently, 1.6 g of obtained conductive particles and 0.4 g of epoxy/acrylic resin (Lock-Tight 3026) were kneaded by using three rolls.

The resistance value between the upper part 21*a* and lower part 21*b* of the via hole conductor 21 of the multi-layer printed wiring board thus fabricated was measured by the four-terminal method, and the specific resistance of the via hole conductor was calculated from the filling volume determined from the thickness of the board and hole diameter, and the result was $1.5 \times 10^{-5}$ Ωcm. After holding this multi-layer printed wiring board in the condition of holding for 30 minutes at each temperature ranging from −40° C. to 125° C. for 1,000 hours, the specific resistance of the via hole conductor was $1.6 \times 10^{-5}$ Ωcm, and the connection resistance was hardly elevated.

Prior Art 2

As a result of using non-chelating conductive particles instead of the conductive particles used in example 4, the specific resistance was $8.0 \times 10^{-5}$ Ωcm, and after holding for 1,000 hours at −40° C. to 125° C. similarly, it was raised to $12.4 \times 10^{-5}$ Ωcm.

In the printed wiring board of the embodiments, the insulating base material layer was formed in one layer, and electrode layers in two layers, but the invention is similarly applied to the printed wiring board comprising two or more layers of insulating base material layers and three or more layers of electrode layers.

As the insulating base material layer in the embodiments, if a compound material of fiber reinforced material and thermosetting resin, or a compound material of aramid nonwoven cloth and epoxy resin was used, by using the conductive paste of the invention, defective connection or defective insulation due to absorption of moisture of the resin can be prevented.

The content of the conductive particles in the conductive paste of the embodiments is preferred to be about 80 wt. % to 95 wt. %. That is, if less than 80 wt. %, conductivity is not exhibited, and if over 95 wt. %, the mutual adhesion of particles becomes weak, and the mechanical strength of the paste decreases.

As clear from the description herein, it is an advantage of the invention that the conductive paste of high connection reliability and insulation reliability can be presented at a low material cost.

Also according to the invention, by using such conductive paste, it is advantageous that the printed wiring board of high reliability can be fabricated at low cost.

What is claimed is:

1. A conductive paste comprising:
   conductive metal particles including at least one metal particle having a particle surface free of a spontaneous oxide film,
   a complex of a same metal as present in said at least one metal particle, said complex being electrically insulating, and being formed on a surface of said conductive metal particle, and
   a binder mainly composed of an insulating resin.

2. A conductive paste of claim 1, wherein said complex for covering said metal particle surface is a monomolecular alignment.

3. A conductive paste of claim 1, wherein said metal is at least one selected from the group consisting of copper, iron, nickel, zinc and tin.

4. A conductive paste of claim 1, wherein said complex is not soluble in water.

5. A conductive paste of claim 4, wherein said complex is at least one selected from the group consisting of metal salt of oxalic acid, metal salt of anthranilic acid, and metal salt of quinoline-8-carboxylic acid.

6. A conductive paste of claim 1, wherein said complex is less than 10 nm in the thickness formed on said particle surface.

7. A conductive paste of claim 1
   wherein said complex is formed on the entire surface of said at least one conductive metal particle.

8. A conductive paste of claim 1,
   wherein said complex is a reaction product of a chelating agent which has a property of dissolving oxide film on said surface of said at least one metal particle to make said surface free of spontaneous oxide film.

9. A conductive paste comprising:
   conductive metal particles including a particle suface free of a spontaneous oxide film,
   a complex of a same metal as present in said conductive metal particles, and
   a binder mainly composed of an insulating resin, wherein said complex is formed on said particle surface at a thickness of less than 10 nm.

10. A conductive paste of claim 9, wherein said complex for covering said metal particle surface is a monomolecular alignment.

11. A conductive paste of claim 9, wherein said metal is at least one selected from the group consisting of copper, iron, nickel, zinc and tin.

12. A conductive paste of claim 9, wherein said complex is not soluble in water.

13. A conductive paste of claim 12, wherein said complex is at least one selected from the group consisting of a metal salt of oxalic acid, a metal salt of anthranilic acid, and a metal salt of quinoline-8-carboxylic acid.

14. A printed wiring board comprising:
   at least one insulating base material layer,
   at least two electrode layers, and
   via hole conductors are formed in via holes penetrating through said insulating base material between said electrode layers, said via hole conductors filling said via holes with said conductive paste of claim 1 which has been cured whereby said electrode layers are electrically connected by said via hole conductors.

15. A printed wiring board of claim 14, wherein said insulating base material layer is a compound material of fiber reinforced material and thermosetting resin.

16. A printed wiring board of claim 14, wherein said insulating base material layer is a compound material of aramid nonwoven cloth and epoxy resin.

17. A printed wiring board of claim 14,
   wherein said complex is a reaction product of a chelating agent which has a property of dissolving oxide film on said surface of said at least one metal particle to make said surface free of spontaneous oxide film.

18. A connecting structure for use in a printed wiring board for connecting an electronic component and the wiring board, said connective structure including a connective paste according to claim 1.

19. A manufacturing method of conductive paste comprising the steps of:
   immersing metal particles in a solution composed of chelating agent and solvent, heating and removing said solvent, and kneading with a binder mainly composed of insulating resin, said chelating agent reacting with spontaneous oxide on said metal particles to dissolve said oxide and form an insulative complex as a reaction product.

20. A manufacturing method for making a conductive paste of claim 19, wherein said chelating agent has a property of dissolving an oxide of at least one of copper, iron, nickel, zinc and tin.

21. A maufacturing method of conductive paste of claim 19, wherein said insulative complex is insoluble in water.

22. A manufacturing method for making a conductive paste of claim 21, wherein said chelating agent is at least one selected from the group consisting of oxalic acid, succinic acid, anthranilic acid, gallotannic acid, quinaldinic acid, quinoline-8-carboxylic acid, thiourea, pyrogallol, phenyl fluorone, 4-chloro-3-methyl-5-nitrobenzene sulfonic acid, and rhodamine B.

23. A manufacturing method for making a conductive paste of claim 19, wherein said chelating agent has a sublimating property.

24. A manufacturing method for making a conductive paste of claim 23, wherein said chelating agent is at least one selected from the group consisting of oxalic acid, anthranilic acid, and quinoline-8-carboxylic acid.

* * * * *